(12) United States Patent
Lee (10) Patent No.: US 10,962,713 B2
(45) Date of Patent: Mar. 30, 2021

(54) OPTICAL WAVEGUIDE STRUCTURE

(71) Applicant: Industrial Technology Research Institute, Hsinchu (TW)

(72) Inventor: Wen-Chin Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/726,904

(22) Filed: Dec. 25, 2019

(65) Prior Publication Data

US 2020/0174191 A1   Jun. 4, 2020

Related U.S. Application Data

(63) Continuation-in-part of application No. 16/558,176, filed on Sep. 2, 2019.

(30) Foreign Application Priority Data

Dec. 4, 2018 (TW) ................................ 107143410

(51) Int. Cl.
    *G02B 6/122*      (2006.01)
    *G02B 6/26*       (2006.01)
    *G02B 6/12*       (2006.01)

(52) U.S. Cl.
    CPC ............ *G02B 6/1223* (2013.01); *G02B 6/26* (2013.01); *G02B 2006/12061* (2013.01)

(58) Field of Classification Search
    CPC ........ G02B 6/1223; G02B 2006/12061; G02B 2006/12119
    See application file for complete search history.

(56) References Cited

U.S. PATENT DOCUMENTS

| 5,078,516 A | 1/1992 | Kapon et al. |
| 7,369,727 B2 | 5/2008 | Shih et al. |
| 9,625,651 B2 | 4/2017 | Kumar et al. |
| 9,823,420 B2 | 11/2017 | Kato et al. |

(Continued)

FOREIGN PATENT DOCUMENTS

| CN | 102159975 | 8/2011 |
| CN | 104749693 | 7/2015 |

(Continued)

OTHER PUBLICATIONS

Arnab Dewanjee et al., "Demonstration of a compact bilayer inverse taper coupler for Si-photonics with enhanced polarization insensitivity, "Optics Express 28194, vol. 24, Issue 25, Dec. 12, 2016, pp. 1-10.

(Continued)

*Primary Examiner* — Omar R Rojas
(74) *Attorney, Agent, or Firm* — JCIPRNET (57) ABSTRACT

An optical waveguide structure including a bottom layer, a middle waveguide layer, and a top cladding layer is provided. The middle waveguide layer is disposed on the bottom layer. The top cladding layer is disposed on the middle waveguide layer and covers the middle waveguide layer. The refractive index of the middle waveguide layer is greater than that of the bottom layer, and is greater than that of the top cladding layer. The optical waveguide structure has a first end region and a second end region. The middle waveguide layer in the first end region has a first end having a width gradually decreased toward the second end region. The top cladding layer in the second end region has a second end having a width gradually decreased away from the first end region.

13 Claims, 10 Drawing Sheets

(56) References Cited

U.S. PATENT DOCUMENTS

| | | | |
|---|---|---|---|
| 9,874,691 B2 | 1/2018 | Mahgerefteh et al. | |
| 2013/0243374 A1 | 9/2013 | Watanabe | |
| 2013/0336346 A1* | 12/2013 | Kobrinsky | H01S 5/0262 |
| | | | 372/26 |
| 2016/0299294 A1* | 10/2016 | Wang | G02B 6/1221 |
| 2017/0052317 A1 | 2/2017 | Mahgerefteh et al. | |
| 2017/0068049 A1 | 3/2017 | Dangel et al. | |
| 2018/0039027 A1 | 2/2018 | Kato et al. | |
| 2018/0180818 A1* | 6/2018 | Jiang | G02B 6/305 |

FOREIGN PATENT DOCUMENTS

| | | |
|---|---|---|
| CN | 107111056 | 8/2017 |
| TW | I417589 | 12/2013 |
| TW | I443395 | 7/2014 |
| TW | 201812359 | 4/2018 |

OTHER PUBLICATIONS

Kevin Kruce et al., "Polymer taper bridge for silicon waveguide to single mode waveguide coupling," Optics Communications, vol. 362, Mar. 1, 2016, pp. 87-95.

Kevin Kruce et al., "Three-dimensional patterning in polymer optical waveguides using focused ion beam milling," Journal of Micro/Nanolithography, MEMS, and MOEMS, vol. 15, Issue 3, Aug. 12, 2016, pp. 1-8.

Jinfeng Mu et al., "Low-Loss Highly Tolerant Flip-Chip Couplers for Hybrid Integration of Si3N4and Polymer Waveguides, " IEEE Photonics Technology Letters, vol. 28, Issue 23, Dec. 1, 2016, pp. 2748-2751.

Rezwanul Haque Khandokar et al., "Performance Enhanced Butt Coupling for Effective Interconnection Between Fiber and Silicon Nanowire," IEEE Journal of Quantum Electronics, vol. 52, Issue 9, Sep. 2016, pp. 1-6.

Lee Carroll et al., "Photonic Packaging: Transforming Silicon Photonic Integrated Circuits into Photonic Devices," Applied Sciences, vol. 6, Issue 12, Dec. 15, 2016, pp. 1-21.

Roger Dangel et al., "Polymer waveguides for electro-optical integration in data centers and high-performance computers, " Optics Express, vol. 23, Issue 4, Feb. 2015, pp. 1-15.

A. La Porta et al., "Silicon photonics packaging for highly scalable optical interconnects," 2015 IEEE 65th Electronic Components and Technology Conference (ECTC), May 2015, pp. 1-6.

"Office Action of Taiwan Counterpart Application," dated Jan. 23, 2019, p. 1-p. 4.

* cited by examiner

OPTICAL WAVEGUIDE STRUCTURE

CROSS-REFERENCE TO RELATED APPLICATION

This application is a continuation-in-part (CIP) application of and claims the priority benefit of U.S. application Ser. No. 16/558,176, filed on Sep. 2, 2019, now pending, which claims the priority benefit of Taiwan application serial no. 107143410, filed on Dec. 4, 2018. The entirety of each of the above-mentioned patent applications is hereby incorporated by reference herein and made a part of this specification.

TECHNICAL FIELD

The technical field is related to an optical waveguide structure.

BACKGROUND

Silicon photonic techniques are the key techniques to reduce the power consumption of high-speed computers and data centers in the future. The optical signal of a silicon photonic chip needs to be transmitted to an optical fiber to achieve the object of two-way signal transmission, and overcoming the huge size difference between silicon waveguide and optical fiber and realizing high-density channel number and simultaneous optical coupling alignment requires an exceptional bridging design with a planar single-mode optical waveguide cable. A typical optical fiber has an outer diameter of about 125 microns, and a silicon waveguide has a width of less than about 0.5 microns. If the silicon waveguide is aligned with the optical fiber spacing, then a large chip area is occupied, and therefore more than several times the number of output terminals and input terminals are lost. Therefore, the planar single-mode optical waveguide cable may be bridged by fan-shaped wiring in order to simultaneously connect a high-density silicon waveguide channel and a low-density optical fiber cable. If the planar single-mode optical waveguide cable is flexible and bendable, then various types of alignment package options may be provided, thereby reducing the cost of chip packaging.

Optical waveguide materials provide a possible solution for the manufacture of flexible and bendable optical waveguide cables. In manufacture, planar single-mode optical waveguide cables must provide an alignment package design with optical fiber and a silicon waveguide. The optical fiber end is aligned with the package via a precision-made fiber optic connector, and the alignment packaging method of the silicon waveguide end is still the focus of research in the world of photonics research or related industries. The technical difficulty lies in the fact that the size of the silicon waveguide and the size of the planar optical waveguide are too different, and the two-way back and forth conversion of the single-mode optical signal mode from the silicon waveguide to the planar optical waveguide requires an exceptional optical coupling structure design to satisfy both low coupling optical loss and high tolerance level.

SUMMARY

An embodiment of the disclosure provides an optical waveguide structure including a bottom layer, a middle waveguide layer, and a top cladding layer. The middle waveguide layer is disposed on the bottom layer. The top cladding layer is disposed on the middle waveguide layer and covers the middle waveguide layer. The refractive index of the middle waveguide layer is greater than that of the bottom layer, and is greater than that of the top cladding layer. The optical waveguide structure has a first end region and a second end region. The middle waveguide layer in the first end region has a first end having a width gradually decreased toward the second end region. The top cladding layer in the second end region has a second end having a width gradually decreased away from the first end region.

An embodiment of the disclosure provides an optical waveguide structure including a bottom layer, a middle waveguide layer, a top cladding layer, and an optical waveguide. The middle waveguide layer is disposed on the bottom layer. The top cladding layer is disposed on the middle waveguide layer and covers the middle waveguide layer. The refractive index of the middle waveguide layer is greater than that of the bottom layer, and is greater than that of the top cladding layer. The optical waveguide structure has a first end region and a second end region. The middle waveguide layer in the first end region has a first end having a width gradually decreased toward the second end region. The top cladding layer in the second end region has a second end having a width gradually decreased away from the first end region. The optical waveguide has a third end and a fourth end opposite to the third end. The third end is disposed on the second end but does not overlap with the first end, wherein a surface connecting the third end and the fourth end is a plane surface, a curved surface, or a combination thereof.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Embodiments and accompanying figures are provided below to more sufficiently explain the disclosure, but the disclosure may still be implemented in a plurality of different forms and should not be construed as limited to the embodiments of the present specification. In the figures, for clarity, each component and the relative size thereof may not be shown according to actual size.

Figure 1A:
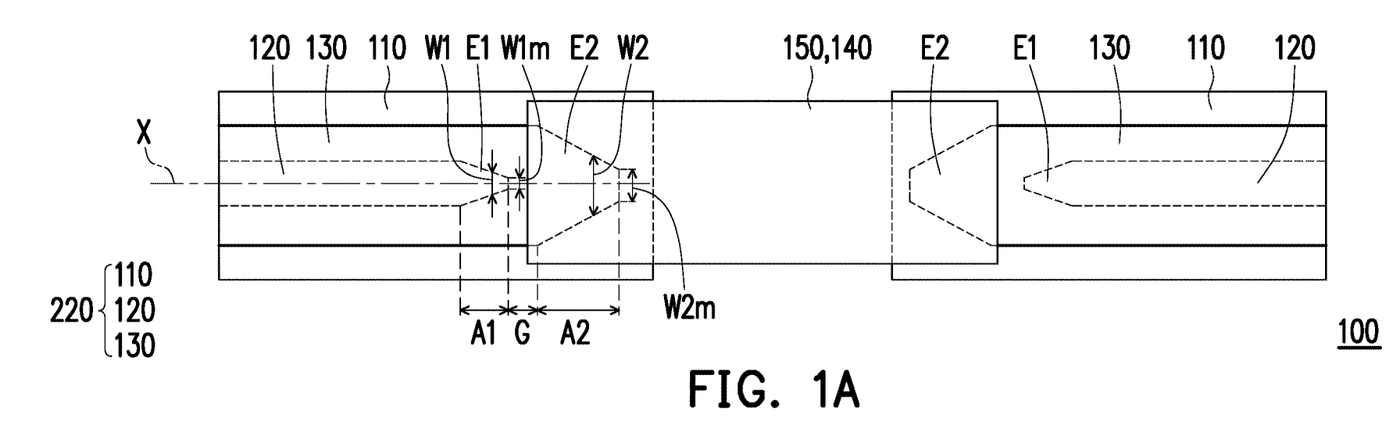
FIG. 1A is a top view of an optical waveguide structure of an embodiment of the disclosure.
Figure 1B:
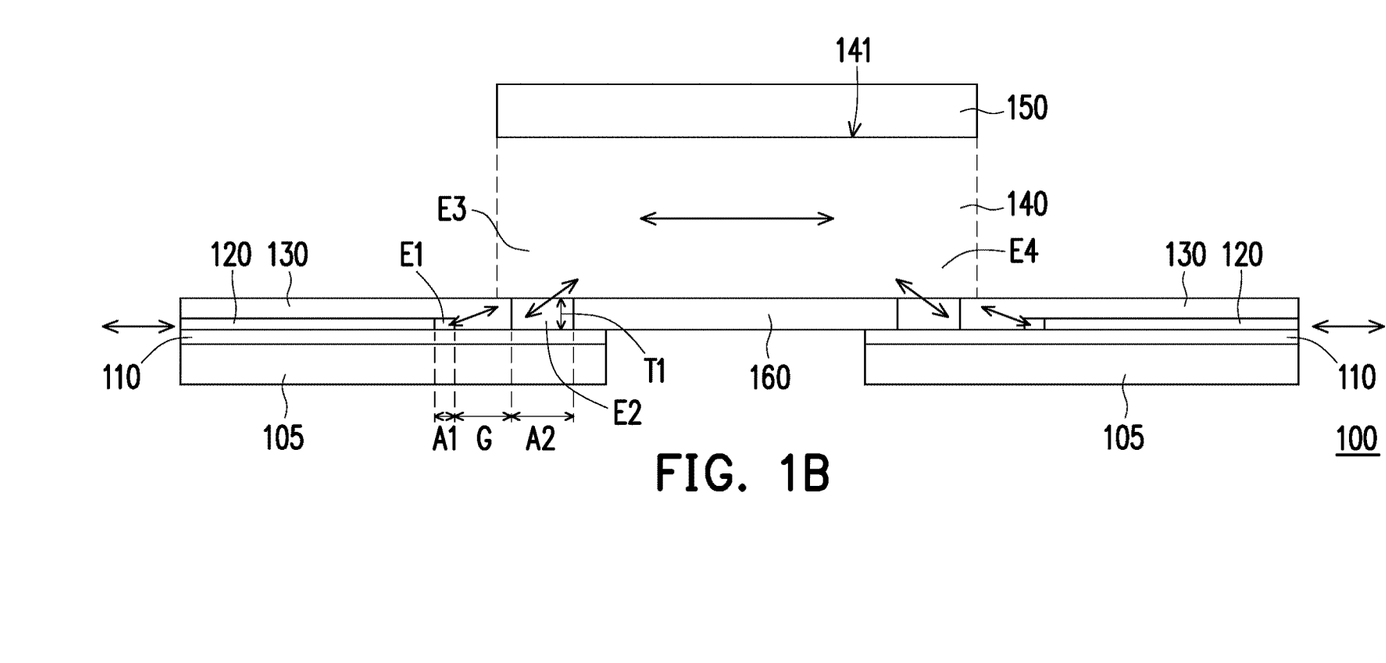
FIG. 1B is a cross section of the optical waveguide structure of FIG. 1A.
Figure 2:
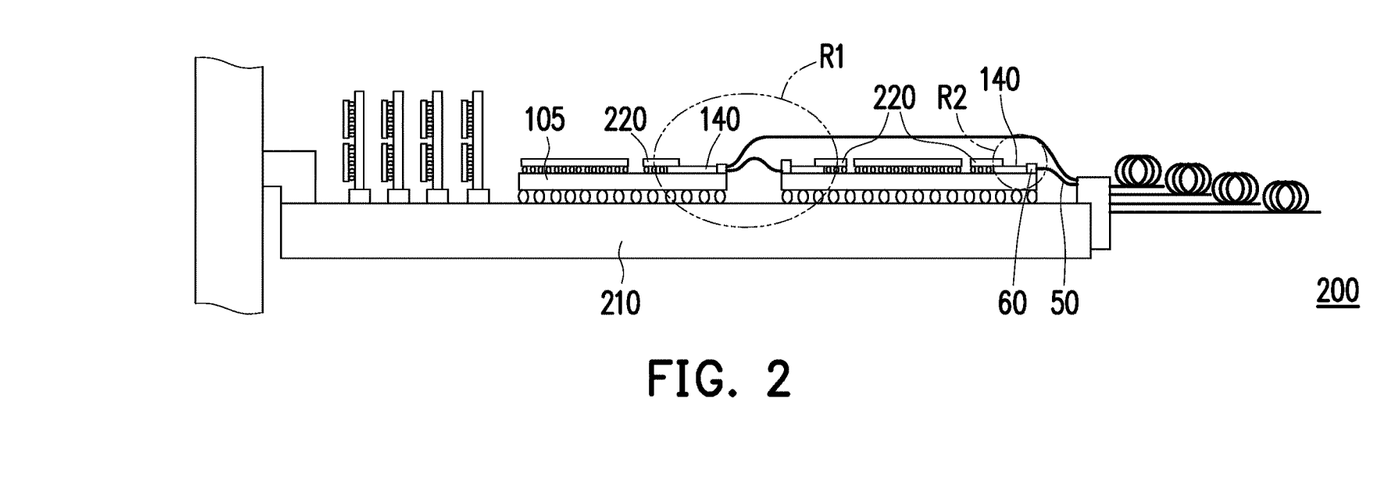
FIG. 2 is a cross section of a photonic chip device having the optical waveguide structure of FIG. 1A.

FIG. 1A is a top view of an optical waveguide structure of an embodiment of the disclosure, FIG. 1B is a cross section of the optical waveguide structure of FIG. 1A, and FIG. 2 is a cross section of a photonic chip device having the optical waveguide structure of FIG. 1A. Referring to FIG. 1A, FIG. 1B, and FIG. 2, an optical waveguide structure 100 of the present embodiment includes a bottom layer 110, a middle waveguide layer 120, and a top cladding layer 130. In the present embodiment, the bottom layer 110 is, for example, an optical waveguide layer disposed on a substrate 105. However, in other embodiments, the bottom layer 110 may also be a substrate that may transmit light.

The middle waveguide layer 120 is disposed on the bottom layer 110. The material of the middle waveguide layer 120 includes silicon or a compound of silicon. In the present embodiment, the middle waveguide layer 120 is, for example, a silicon waveguide layer suitable for transmitting near-infrared light. The top cladding layer 130 is disposed on the middle waveguide layer 120 and covers the middle waveguide layer 120. In the present embodiment, the top cladding layer 130 may wrap the upper surface and the side of the middle waveguide layer 120. The refractive index of the middle waveguide layer 120 is greater than the refractive index of the bottom layer 110 and greater than the refractive index of the top cladding layer 130. For example, a near-infrared optical signal having a wavelength of 1310 nm may be transmitted in the middle waveguide layer 120 and the top cladding layer 130, and the refractive index of the middle waveguide layer 120 for the near-infrared optical signal is greater than the refractive index of the bottom layer 110 for the near-infrared optical signal and also greater than the refractive index of the top cladding layer 130 for the near-infrared optical signal. For example, the value of the refractive index of the top cladding layer 130 is between the refractive index of the middle waveguide layer 120 and the refractive index of the bottom layer 110.

The material of the top cladding layer 130 may be silicon oxynitride (SiON), silicon oxide, or other materials suitable for transmitting near-infrared light, but is not limited thereto. The optical waveguide structure 100 has a first end region A1 and a second end region A2, and the middle waveguide layer 120 in the first end region A1 has a first end E1 having a width W1 gradually decreased toward the second end region A2. The top cladding layer 130 in the second end region A2 has a second end E2 having a width W2 gradually decreased away from the first end region A1. In the present embodiment, the top cladding layer 130 is present at a central axis X position of the optical waveguide structure 100 in the second end region A2. In detail, in the second end region A2, the middle waveguide layer 120 is no longer present, and is replaced by the top cladding layer 130.

In the present embodiment, the optical waveguide structure 100 further includes an optical waveguide 140. An end of the optical waveguide 140 is disposed on the second end E2 but is not overlapped with the first end E1, that is, the optical waveguide 140 covers only the second end region A2 and is not disposed in the region provided with the middle waveguide layer 120. At least one of the sides of the optical waveguide 140 may have a cladding layer 150. In the present embodiment, for example, the upper and lower sides of the optical waveguide 140 respectively have a cladding layer 150 and a cladding layer 160. In addition, the cladding layer 150 may also be replaced by a substrate. In the present embodiment, this end of the optical waveguide 140 is in contact with the second end E2. In the present embodiment, the bottom layer 110, the middle waveguide layer 120, and the top cladding layer 130 may be part of a photonic chip 220 (shown in FIG. 2), and the photonic chip 220 is, for example, a silicon photonic chip. In detail, in FIG. 1A and FIG. 1B, each of the left and right sides may be a photonic chip 220. The photonic chip 220 may be disposed on the substrate 105, which is, for example, a carrier plate. The substrate 105 may further be disposed on a motherboard 210 of the photonic chip device 200. The optical waveguide structure 100 shown in FIG. 1A and FIG. 1B may be a light transmission structure between adjacent photonic chips 220 in a region R1 of FIG. 2. In particular, the optical waveguide 140 may be bendable or in a straight-line state. However, in other embodiments, the optical waveguide structure 100 may also be a light transmission structure on the same substrate 105. In the present embodiment, the optical signal from the photonic chip 220 on a substrate 105 may be transmitted to the first end E1 via the middle waveguide layer 120 and then enter the top cladding layer 130, and after the function of optical mode conversion is provided via the second end E2 of the top cladding layer 130 in the second end region A2, the optical signal enters the optical waveguide 140 with a larger transmission power. The optical signal transmitted in the optical waveguide 140 may then enter the middle waveguide layer 120 with a larger transmission power by providing the function of optical mode conversion via the second end E2 of the top cladding layer 130 in the second end region A2. As such, in the photonic chip 220 on the left side in FIG. 1A, the optical signal may be transmitted to the photonic chip 220 on the right side in FIG. 1A via the middle waveguide layer 120, the second end E2 of the top cladding layer 130, the optical waveguide 140, the second end E2 of the top cladding layer 130, and the middle waveguide layer 120 in order. On the contrary, the optical signal of the photonic chip 220 on the right side in FIG. 1A may also be transmitted to the photonic chip 220 on the left side in FIG. 1A via the middle waveguide layer 120, the second end E2 of the top cladding layer 130, the optical waveguide 140, the second end E2 of the top cladding layer 130, and the middle waveguide layer 120 in order. Therefore, two-way transmission may be achieved.

Furthermore, since the middle waveguide layer 120 in the first end region A1 has a first end E1 having a width W1 gradually decreased toward the second end region A2, the effective refractive index of the middle waveguide layer 120 in the first end region A1 may be reduced to be more closely matched with the refractive index of the top cladding layer 130 to improve optical coupling efficiency. Moreover, since the top cladding layer 130 in the second end region A2 has a second end E2 having a width W2 gradually decreased away from the first end region A1, the effective refractive index of the top cladding layer 130 in the second end region A2 may be reduced to be more closely matched with the refractive index of the optical waveguide 140 to improve optical coupling efficiency.

Figure 3:
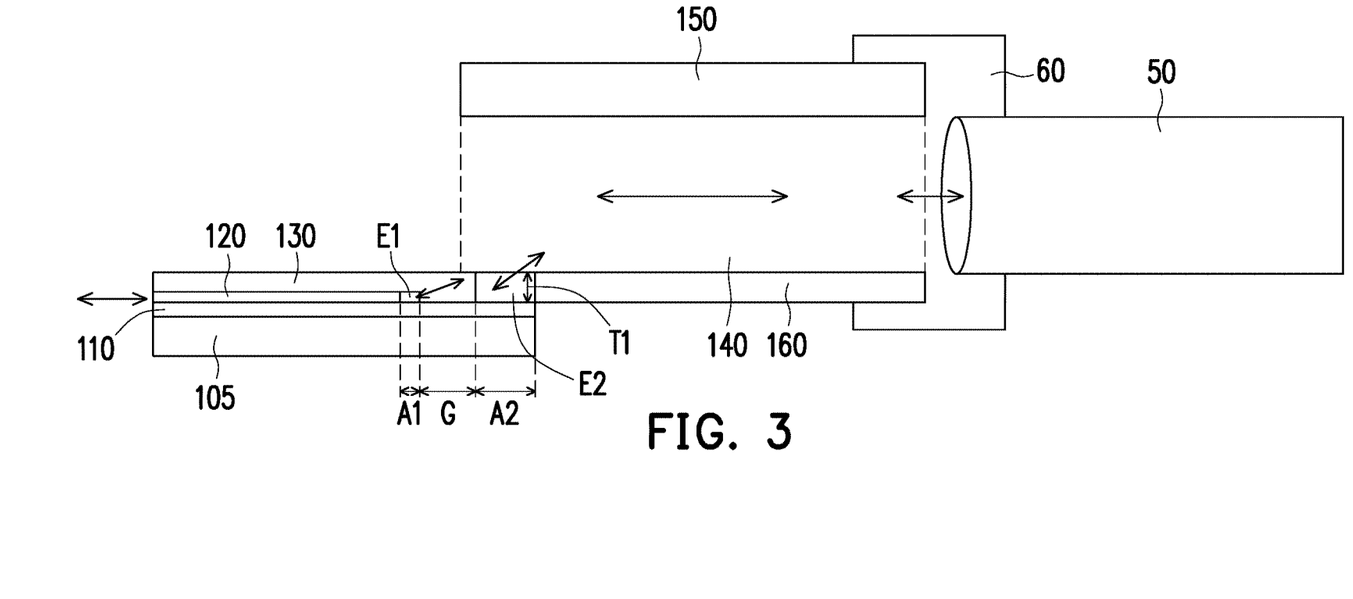
FIG. 3 is another application embodiment of the optical waveguide structure of the disclosure.

Moreover, as shown in FIG. 3, the optical signal of the photonic chip 220 on the left side of FIG. 3 may also be transmitted to an optical cable 50 via the middle waveguide layer 120, the second end E2 of the top cladding layer 130, and the optical waveguide 140 in order and be transmitted to the outside via the optical cable 50. Moreover, the optical signal from the outside may also be transmitted to the photonic chip 220 via the optical cable 50, the optical waveguide 140, the second end E2 of the top cladding layer 130, and the middle waveguide layer 120. The optical transmission structure here may be the structure located in a region R2 in FIG. 2. The optical coupling between the optical waveguide 140 and the optical cable 50 may be achieved via various connectors 60. In detail, in the present embodiment, only one end of the optical waveguide 140 is in contact with the second end E2 on the substrate 105, and another end is optically coupled to the optical cable 50 via the connector 60. In an embodiment, the optical cable 50 may be an optical waveguide or an optical fiber. In the present embodiment, a minimum width W1$m$ of the first end E1 is greater than 0.01 microns. For example, the minimum width W1$m$ of the first end E1 is greater than 0.01 microns and less than 0.2 microns. In the present embodiment, a minimum width W2$m$ of the second end E2 is greater than 0.01 microns. For example, the minimum width W2$m$ of the second end E2 is greater than 0.1 microns and less than 2 microns. In the present embodiment, a maximum thickness T1 of the top cladding layer 130 is less than 3 microns. For example, a maximum thickness T1 of the top cladding layer 130 is less than 1 micron. It is to be noted that the maximum thickness T1 of the top cladding layer 130 refers to the thickness of the top cladding layer 130 directly covering the bottom layer 110.

In the present embodiment, there is a spacing G between the first end region A1 and the second end region A2. As such, when the optical waveguide 140 covers the second end E2, there may be a margin that does not cover the first end E1. In the present embodiment, the spacing G falls within the range of 0.1 microns to 200 microns.

Furthermore, in the present embodiment, the middle waveguide layer 120 in the first end region A1 has a first end E1 having a width W1 gradually decreased toward the second end region A2, but the thickness of the middle waveguide layer 120 in the first end region A1 (i.e., the thickness in the direction of the maximum thickness T1 in the drawings, or the thickness in the direction perpendicular to the width W1) may remain unchanged. Furthermore, the top cladding layer 130 in the second end region A2 has a second end E2 having a width W2 gradually decreased away from the first end region A1, but the thickness of the top cladding layer 130 in the second end region A2 may remain unchanged. That is to say, the first end E1 and the second end E2 may be a two-dimensionally tapered structure, and may not be a three-dimensionally tapered (i.e., the thickness is also gradually reduced) structure, and therefore the optical waveguide structure 100 of the present embodiment may be manufactured via a simple process, and good optical coupling efficiency may be achieved.

Figure 4:
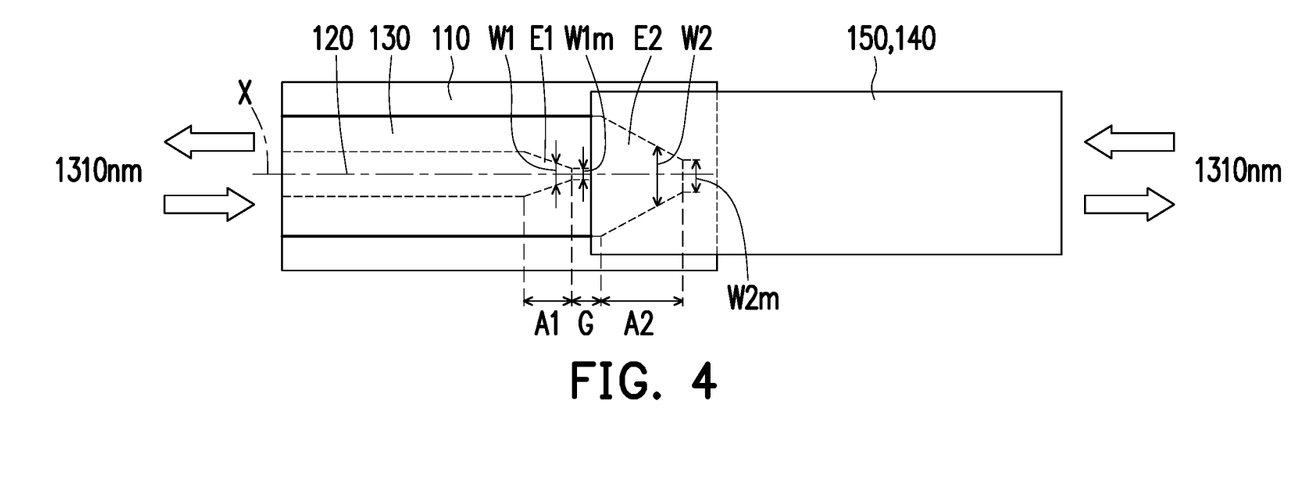
FIG. 4 is a schematic of the left half of the optical waveguide structure of FIG. 1A.

FIG. 4 is a schematic of the left half of the optical waveguide structure of FIG. 1. In an embodiment, referring to FIG. 4, the optical coupling efficiency of the optical waveguide structure 100 at a wavelength of 1310 nm is simulated and calculated by using the 2017 version of the Rsoft BeamPROP software, and the calculation conditions are as follows:

1. The middle waveguide layer 120: the width is 0.45 microns, the thickness is 0.22 microns, the minimum width W1$m$ of the first end E1 is 0.12 microns, and the length of the first end E1 (i.e., the amount of extension of the first end region A1 in the direction of the central axis X) is 450 microns, the refractive index is 3.5;
2. The upper cladding layer 130: the material is silicon oxynitride (SiON), the width is 3 microns, the thickness is 0.5 microns, the minimum width W2$m$ of the second end E2 is 1 micron, and the length of the second end E2 (i.e., the amount of extension of the second end region A2 in the direction of the central axis X) is 600 microns, and the refractive index is 1.67;
3. The bottom layer 110: the material is silicon dioxide ($SiO_2$), the width is 6 microns, the thickness is 2 microns, and the refractive index is 1.4468;
4. The optical waveguide 140: the width is 6 microns, the thickness is 6 microns, and the refractive index is 1.569;
5. The coating layer 150 (or substrate): the width is 8 microns, the thickness is 6 microns, and the refractive index is 1.54;
6. Background refractive index is 1.54, and polarization mode of optical signal: TE mode.

Via the calculation of the software and parameters, the optical coupling efficiency of the optical signal transmitted from the middle waveguide layer 120 to the optical waveguide 140 is 83%, and the optical coupling efficiency of the optical signal transmitted from the optical waveguide 140 to the middle waveguide layer 120 is 65%.

Figure 5:
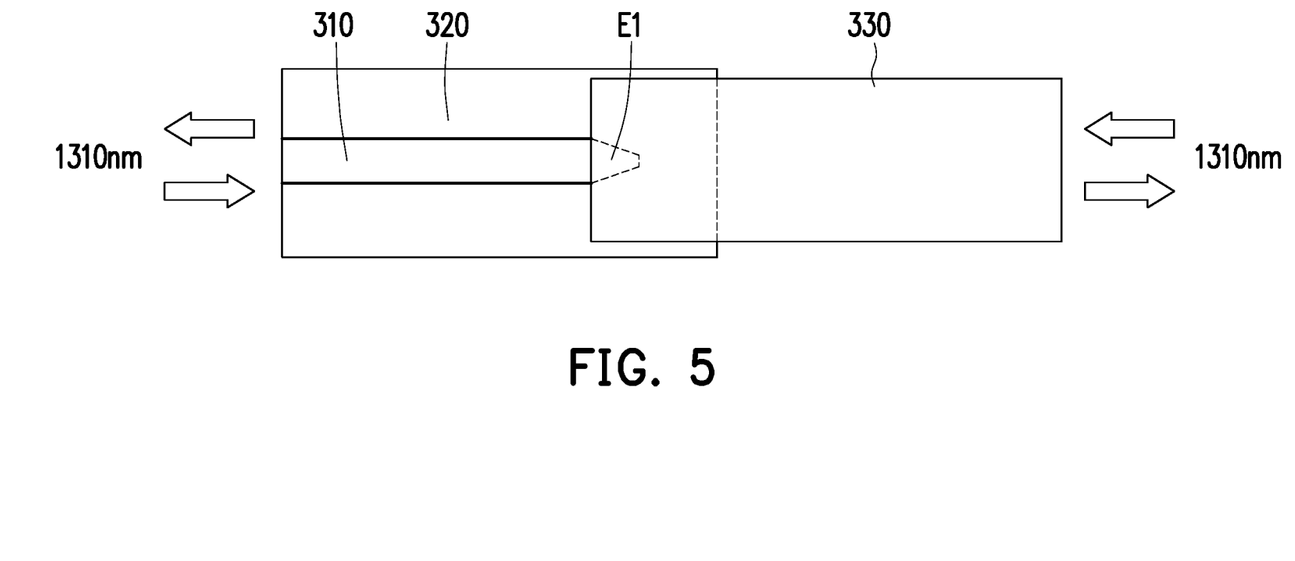
FIG. 5 is a comparative example of the optical waveguide structure of FIG. 4.

FIG. 5 is a comparative example of the optical waveguide structure of FIG. 4. Referring to FIG. 5, in the comparative example of FIG. 5, the optical waveguide structure 300 does not have the top cladding layer 130, and the first end E1 of the silicon waveguide layer 310 is in contact with an end of the optical waveguide 330. The rest of the structure is similar to the optical waveguide structure 100 of FIG. 4. The optical coupling efficiency of the optical waveguide structure 300 at a wavelength of 1310 nm is simulated and calculated by using the 2017 version of the Rsoft BeamPROP software, and the calculation conditions are as follows:

1. The silicon waveguide layer 310: the width is 0.35 microns, the thickness is 0.145 microns, the minimum width of the first end E1 is 0.12 microns, the length of the first end E1 is 450 microns, the refractive index is 3.5;
2. The bottom layer 320: the material is silicon dioxide ($SiO_2$), the width is 6 microns, the thickness is 2 microns, and the refractive index is 1.4468;
3. The optical waveguide 330: the width is 6 microns, the thickness is 6 microns, and the refractive index is 1.56;
4. The coating layer or substrate of the optical waveguide 330: the width is 8 microns, the height is 6 microns, and the refractive index is 1.55;
5. Background refractive index is 1.46, polarization mode of optical signal: TE.

Via the calculation of the software and parameters, the optical coupling efficiency of the optical signal transmitted from the silicon waveguide layer 310 to the optical waveguide 330 is 35%, and the optical coupling efficiency of the optical signal transmitted from the optical waveguide 330 to the silicon waveguide layer 310 is 31%. Comparing the calculation results of the embodiment of FIG. 4 with the comparative example of FIG. 5, it is understood that the embodiment of FIG. 4 of the disclosure does have good optical coupling efficiency in both directions.

Another set of calculated parameters of the embodiment of FIG. 4 are calculated with the following conditions (the optical coupling efficiency of the optical waveguide structure 100 is simulated and calculated using the 2017 version of the Rsoft BeamPROP software at a wavelength of 1310 nm):
1. The middle waveguide layer 120: the width is 0.35 microns, the thickness is 0.145 microns, the minimum width W1m of the first end E1 is 0.12 microns, the length of the first end E1 is 450 microns, and the refractive index is 3.5;
2. The upper cladding layer 130: the material is silicon oxynitride (SiON), the width is 3 microns, the thickness is 0.5 microns, the minimum width W2m of the second end E2 is 1 micron, and the length of the second end E2 is 600 microns, and the refractive index is 1.67;
3. The bottom layer 110: the material is silicon dioxide ($SiO_2$), the width is 6 microns, the thickness is 2 microns, and the refractive index is 1.4468;
4. The optical waveguide 140: the width is 6 microns, the thickness is 6 microns, and the refractive index is 1.56;
5. The coating layer 150 (or substrate): the width is 8 microns, the thickness is 6 microns, and the refractive index is 1.55;
6. Background refractive index is 1.46, polarization mode of optical signal: TE mode.

Via the calculation of the software and parameters, the optical coupling efficiency of the optical signal transmitted from the middle waveguide layer 120 to the optical waveguide 140 is 68%, and the optical coupling efficiency of the optical signal transmitted from the optical waveguide 140 to the middle waveguide layer 120 is 44%. Such optical coupling efficiency is also superior to the optical coupling efficiency of the comparative example of FIG. 5.

Figure 6A:
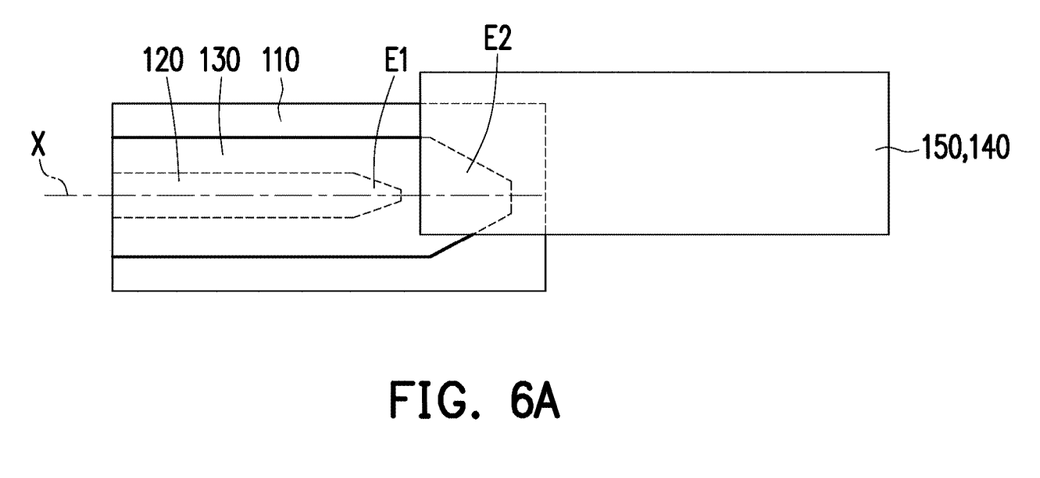
FIG. 6A and FIG. 6B show a situation in which the optical waveguide in FIG. 4 is laterally displaced with respect to the middle waveguide layer.
Figure 6B:
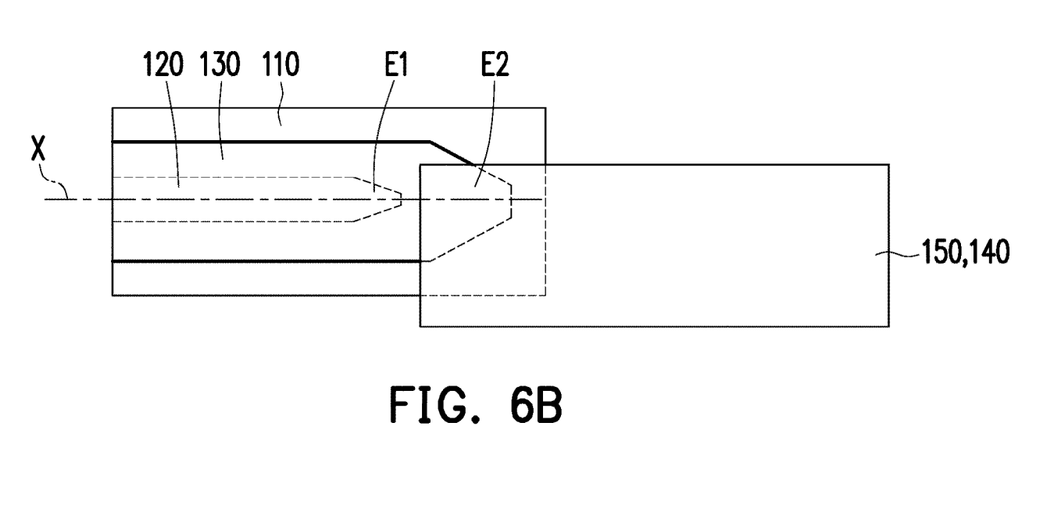
Figure 7:
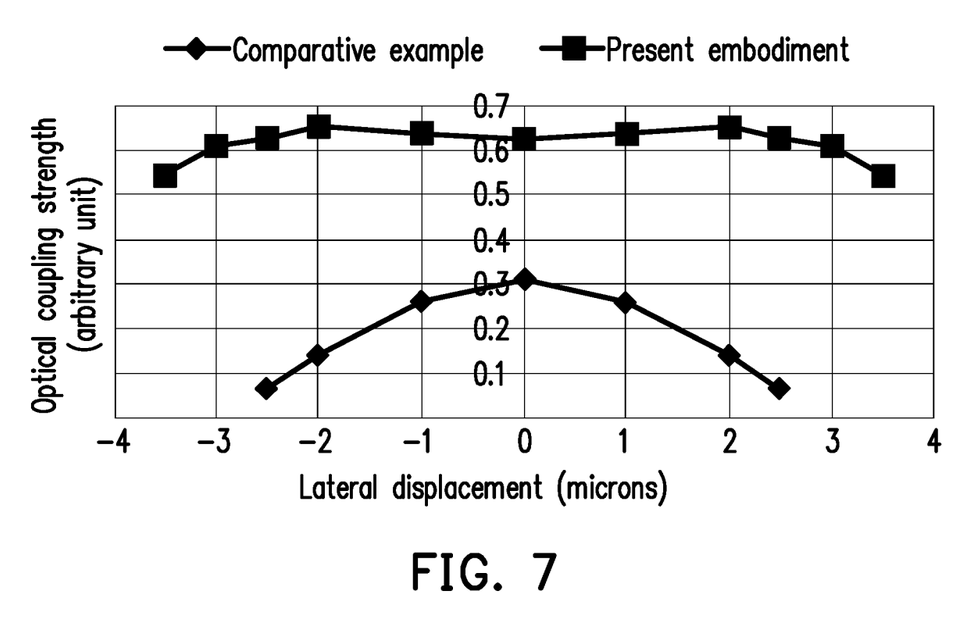
FIG. 7 is a graph showing optical coupling strength variation when the optical waveguides in the embodiment of FIG. 4 and the comparative example of FIG. 5 are laterally displaced with respect to a middle waveguide layer or a silicon waveguide layer.

FIG. 6A and FIG. 6B show a situation in which the optical waveguide 140 in FIG. 4 is laterally (i.e., perpendicular to the extending direction of the middle waveguide layer 120, such as the direction of the central axis X) displaced with respect to the middle waveguide layer 120, and FIG. 7 is a graph of optical coupling strength variation when the optical waveguides 140 and 330 in the embodiment of FIG. 4 and the comparative example of FIG. 5 are laterally displaced with respect to the middle waveguide layer 120 or the silicon waveguide layer 310. The curve labeled as comparative example is a curve belonging to the comparative example of FIG. 5, and the curve labeled as present embodiment is a curve belonging to the another set of calculated parameters of the embodiment of FIG. 4 of the disclosure. It may be clearly seen from the two curves that the optical coupling strength of the embodiment of FIG. 4 is not susceptible to the amount of lateral displacement. Therefore, the optical waveguide structure 100 of the present embodiment has a greater position tolerance when the optical waveguide 330 is coupled to the second end E2.

Figure 8:
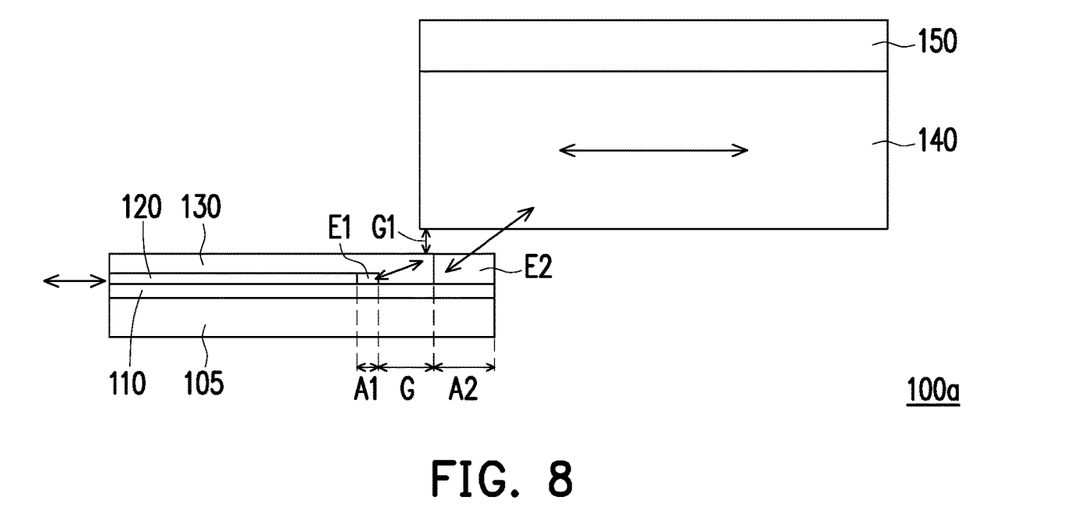
FIG. 8 is a cross section of an optical waveguide structure of another embodiment of the disclosure.

FIG. 8 is a cross section of an optical waveguide structure of another embodiment of the disclosure. Referring to FIG. 8, an optical waveguide structure 100a of the present embodiment is similar to the optical waveguide structure 100 of FIG. 4. It is to be noted that in the optical waveguide structure 100a of the present embodiment, a gap G1 is kept between an end of the optical waveguide 140 and the second end E2, and the second end E2 is evanescently coupled to the optical waveguide 140. Further, the gap G1 is, for example, greater than 0 and less than or equal to 1 micron.

In an embodiment, the optical coupling efficiency of the optical waveguide structure 100 at a wavelength of 1310 nm is simulated and calculated by using the 2017 version of the Rsoft BeamPROP software, and the calculation conditions are as follows:
1. The middle waveguide layer 120: the width is 0.45 microns, the thickness is 0.22 microns, the minimum width W1m of the first end E1 is 0.12 microns, the length of the first end E1 is 450 microns, and the refractive index is 3.5;
2. The upper cladding layer 130: the material is silicon oxynitride (SiON), the width is 3 microns, the thickness is 0.5 microns, the minimum width W2m of the second end E2 is 1 micron, the length of the second end E2 is 600 microns, and the refractive index is 1.67;
3. The bottom layer 110: the material is silicon dioxide ($SiO_2$), the width is 6 microns, the thickness is 2 microns, and the refractive index is 1.4468;
4. The optical waveguide 140: the width is 6 microns, the thickness is 6 microns, and the refractive index is 1.569;
5. The coating layer 150 (or substrate): the width is 8 microns, the thickness is 6 microns, and the refractive index is 1.54;
6. Background refractive index is 1.54, polarization mode of optical signal: TE mode.

Via the calculation of the above software and parameters, the calculation results in the following table may be obtained:

| Gap G1 (microns) | Optical coupling strength (arbitrary unit) from the middle waveguide layer 120 to the waveguide 140 | Optical coupling strength (arbitrary unit) from the waveguide 140 to the middle waveguide layer 120 |
| --- | --- | --- |
| 0 | 0.83 | 0.65 |
| 0.3 | 0.88 | 0.60 |
| 0.5 | 0.81 | 0.54 |
| 1 | 0.49 | 0.25 |

The gap G1 may be filled with air or an adhesive, and both may achieve evanescent coupling between the top cladding layer 130 and the optical waveguide 140.

Figure 9:
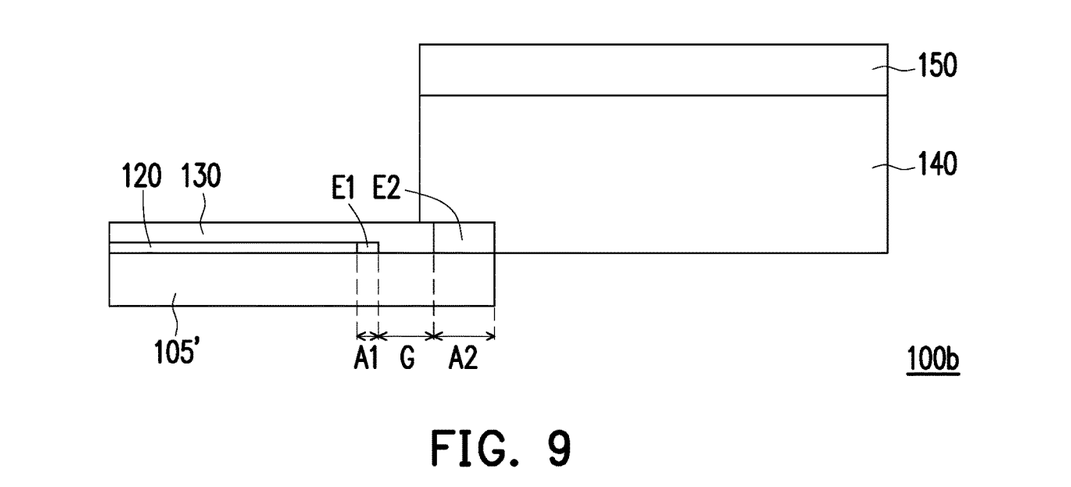
FIG. 9 is a cross section of an optical waveguide structure of yet another embodiment of the disclosure.

FIG. 9 is a cross section of an optical waveguide structure of yet another embodiment of the disclosure. An optical waveguide structure 100b of the present embodiment is similar to the optical waveguide structure 100 of FIG. 4. It is to be noted that, in the optical waveguide structure 100b of the present embodiment, an end of the optical waveguide 140 wraps the second end E2, i.e., covers both the upper surface and the side surface of the second end E2. Thus, the optical signal from the middle waveguide layer 120 may still be transmitted to the optical waveguide 140 via the second end E2, and the optical signal from the optical waveguide 140 may also be transmitted to the middle waveguide layer 120 via the second end E2.

Referring to FIG. 4 again, the optical waveguide structure 100 of FIG. 4 is simulated to generate different optical coupling efficiencies when the top cladding layer 130 adopts different refractive indices and the refractive index of the optical waveguide 140 is different.

In an embodiment, the optical coupling efficiency of the optical waveguide structure 100 at a wavelength of 1310 nm is simulated and calculated by using the 2017 version of the Rsoft BeamPROP software, and the calculation conditions are as follows:

1. The middle waveguide layer 120: the width is 0.45 microns, the thickness is 0.22 microns, the minimum width W1m of the first end E1 is 0.12 microns, the length of the first end E1 is 450 microns, and the refractive index is 3.5;
2. The upper cladding layer 130: the material is silicon oxynitride (SiON), the width is 3 microns, the thickness is 0.5 microns, the minimum width W2m of the second end E2 is 1 micron, the length of the second end E2 is 600 microns, and the refractive index is 1.67 or 1.65;
3. The bottom layer 110: the material is silicon dioxide ($SiO_2$), the width is 6 microns, the thickness is 2 microns, and the refractive index is 1.4468;
4. The optical waveguide 140: the width is 6 microns, the thickness is 6 microns, and the refractive index is 1.569 or 1.544;
5. The coating layer 150 (or substrate): the width is 8 microns, the thickness is 6 microns, and the refractive index is 1.54 or 1.537;
6. Background refractive index is 1.54 or 1.537, polarization mode of optical signal: TE mode.

Figure 10A:
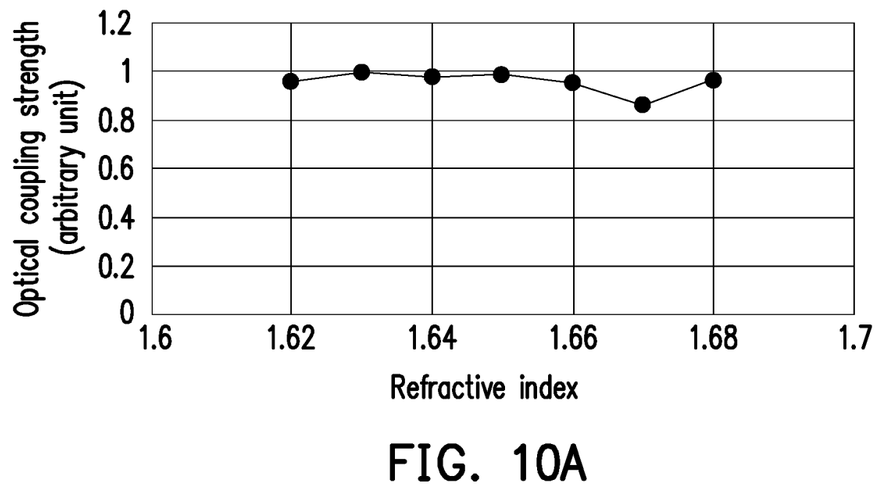
FIG. 10A is a line graph of the optical coupling strength of the optical waveguide structure of FIG. 4 from the optical waveguide to the middle waveguide layer under different refractive indices of the top cladding layer.
Figure 10B:
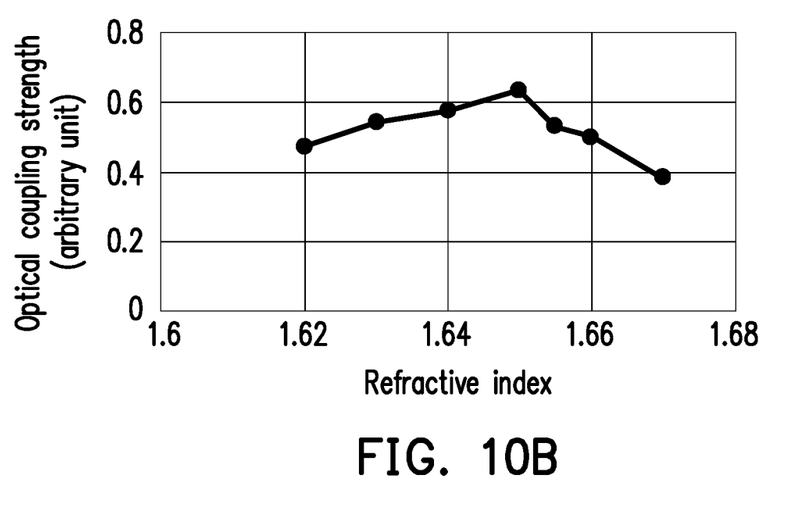
FIG. 10B is a line graph of the optical coupling strength of the optical waveguide structure of FIG. 4 from the middle waveguide layer to the optical waveguide under different refractive indices of the top cladding layer.

The results of FIG. 10A and FIG. 10B may be obtained by the calculation of the above software and parameters. FIG. 10A is a line graph of the optical coupling strength of the optical waveguide structure of FIG. 4 from the optical waveguide to the middle waveguide layer under different refractive indices of the top cladding layer. FIG. 10B is a line graph of the optical coupling strength of the optical waveguide structure of FIG. 4 from the middle waveguide layer to the optical waveguide under different refractive indices of the top cladding layer. Referring to FIG. 4, FIG. 10A, and FIG. 10B, when the refractive index of the optical waveguide 140 is changed from 1.569 to 1.544 and the refractive index of the cladding layer 150 thereof is changed from 1.54 to 1.537, the architecture of the optical waveguide structure 100 of the present embodiment allows the designer to not have to recreate the mask defining the pattern of the top cladding layer 130 in order to maintain the optical coupling efficiency, and the refractive index of the top cladding layer 130 may be changed simply by varying the manufacture formula of the top cladding layer 130. It may be known from FIG. 10A and FIG. 10B that, when the refractive index of the top cladding layer 130 is 1.65, the top cladding layer 130 has good optical coupling efficiency for the optical waveguide 140 having a refractive index of 1.544, and when the refractive index of the top cladding layer 130 falls within the range of 1.63 to 1.66, the top cladding layer 130 has stable optical coupling efficiency for the optical waveguide 140 having a refractive index of 1.544.

Figure 11A:
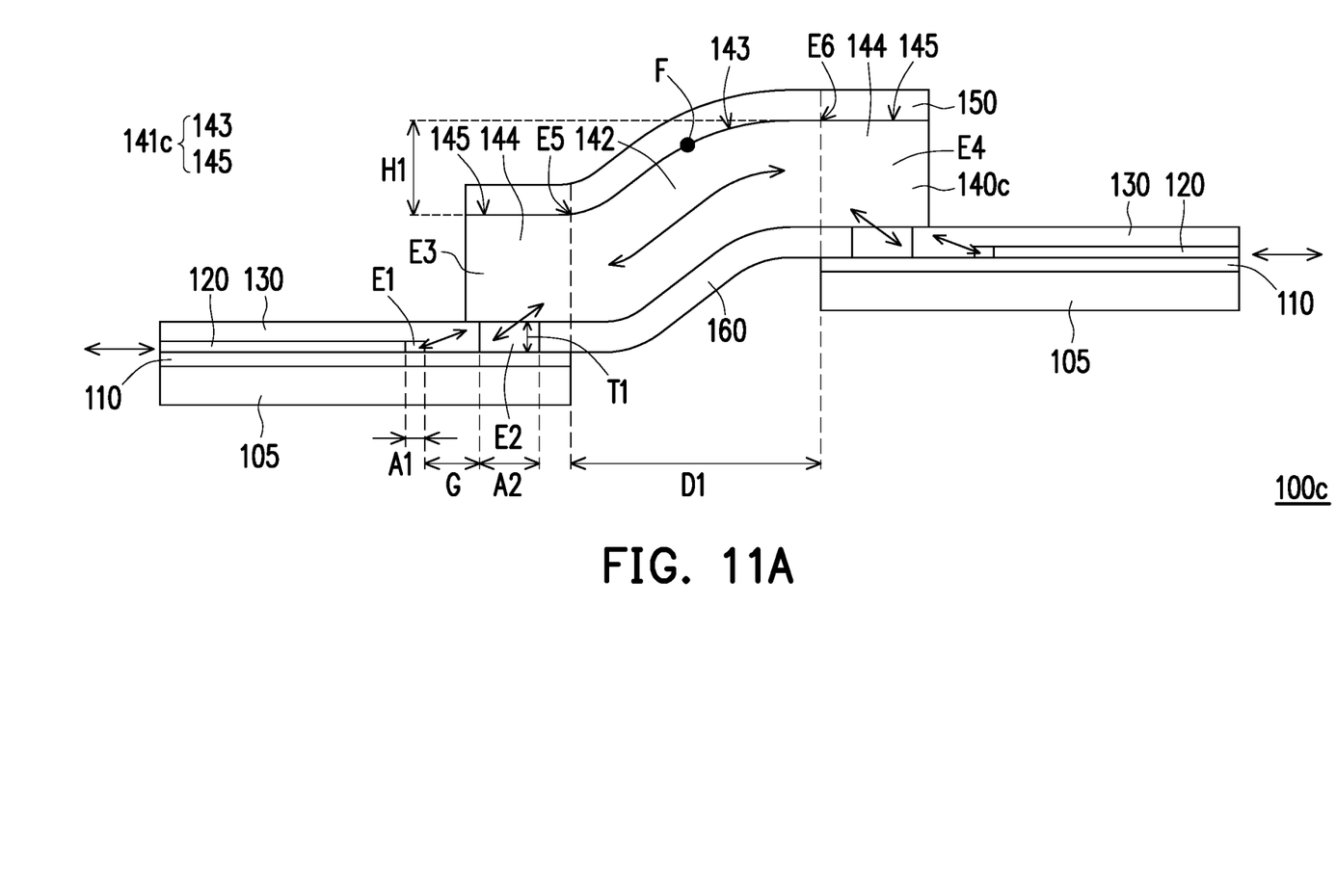
FIG. 11A is a schematic cross-sectional view of an optical waveguide structure according to another embodiment of the disclosure.
Figure 11B:
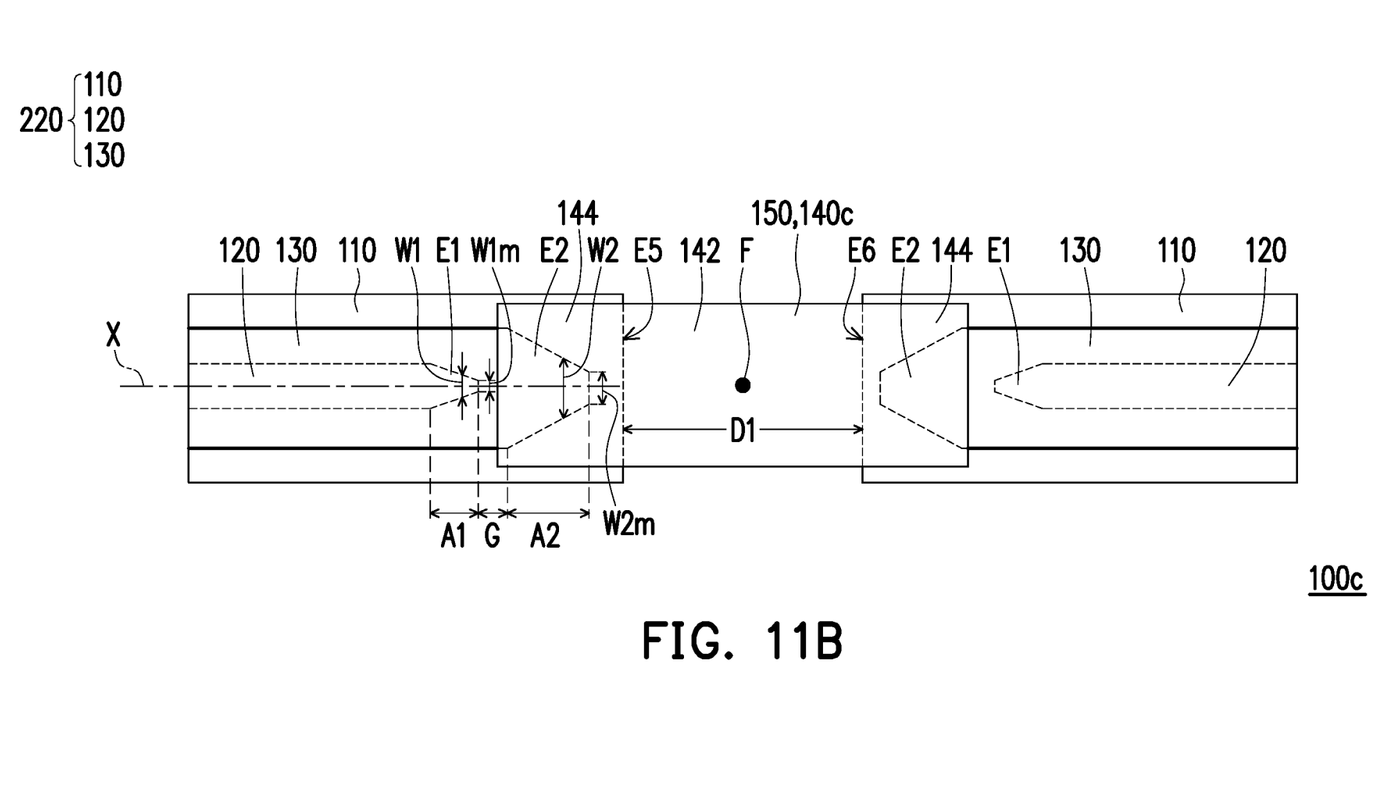
FIG. 11B is a schematic top view of the left half of the optical waveguide structure in FIG. 11A.

FIG. 11A is a schematic cross-sectional view of an optical waveguide structure according to another embodiment of the disclosure, and FIG. 11B is a schematic top view of the left half of the optical waveguide structure in FIG. 11A. Referring to FIGS. 11A and 11B, an optical waveguide structure 100c in this embodiment is similar to the optical waveguide structure 100 in FIG. 1A, FIG. 1B, and FIG. 4. It is to be noted that in the optical waveguide structure 100 in FIG. 1B, the optical waveguide 140 has a third end E3 and a fourth end E4 opposite to the third end E3, and a surface 141 of the optical waveguide 140 connecting the third end E3 and the fourth end E4 is a plane surface. However, in the optical waveguide structure 100c in this embodiment, as shown in FIGS. 11A and 11B, a surface 141c of the optical waveguide 140c connecting the third end E3 and the fourth end E4 of the optical waveguide 140c is a combination of a curved surface 143 and at least one plane surface 145 (two plane surfaces 145 are exemplarily shown in FIG. 11A). In other words, in this embodiment, the optical waveguide 140c includes two straight portions 144 and a curved portion 142, which is S-shaped and connects the two straight portions 144. For example, the curved portion 142 is an S-shaped portion having a fifth end E5 and a sixth end E6 opposite to the fifth end E5. The S-shape means that the curved surface 143 has an inflection point F. In this embodiment, the third end E3 and the fourth end E4 are located at different height levels, respectively, and the two top cladding layers 130 coupled by the optical waveguide 140c are located at different height levels, respectively. In this embodiment, the height levels may be the heights in a direction perpendicular to the substrate 105; that is, the heights in the thickness direction of the top cladding layer 130, i.e. the heights in the direction of the maximum thickness T1. In this embodiment, the ratio of the height difference H1 between the third end E3 and the fourth end E4 to the distance D1 between the fifth end E5 and the sixth end E6 is less than 0.4.

In an embodiment, the optical coupling efficiency of the curved portion 142 of the optical waveguide 140c at a wavelength of 1310 nm is simulated and calculated by using the 2018 version of the Rsoft BeamPROP software, and the calculation conditions are as follows:
1. The curved portion 142 of the optical waveguide 140c: the height difference H1 between the fifth end E5 and the sixth end E6 (same as between the third end E3 and the fourth end E4) is 1000 microns (μm), the width is 6 microns, the thickness is 6 microns, the length is 5000 microns, and the curved portion 142 is S-shaped with a radius of curvature being 6500 microns and has a refractive index being 1.569;
2. Background refractive index is 1.544, polarization mode of optical signal: TE mode.

The result of the simulation is that the optical coupling efficiency of the curved portion 142 of the optical waveguide 140c is 90% or more; that is, after a light passes through the curved portion 142, the intensity of the light is maintained to be 90% or more of the intensity of the light before entering the curved portion 142. Therefore, by using the flexible optical waveguide 140c, two middle waveguide layers 120, two components or two chips coupled by the flexible optical waveguide 140c may be located at different height levels, and the optical coupling efficiency is still maintained good.

In another embodiment, the optical coupling efficiency of the optical waveguide structure 100c at a wavelength of 1310 nm is simulated and calculated by using the 2018 version of the Rsoft BeamPROP software, and the calculation conditions are as follows:
1. The middle waveguide layer 120: the width is 0.45 microns, the thickness is 0.22 microns, the minimum width W1m of the first end E1 is 0.12 microns, and the length of the first end E1 (i.e., the amount of extension of the first end region A1 in the direction of the central axis X) is 450 microns, the refractive index is 3.5;
2. The upper cladding layer 130: the material is silicon oxynitride (SiON), the width is 3 microns, the thickness is 0.5 microns, the minimum width W2m of the second end E2 is 1 micron, and the length of the second end E2 (i.e., the amount of extension of the second end region A2 in the direction of the central axis X) is 600 microns, and the refractive index is 1.67;
3. The bottom layer 110: the material is silicon dioxide ($SiO_2$), the width is 6 microns, the thickness is 2 microns, and the refractive index is 1.4468;
4. The straight portion 144 of the optical waveguide 140c: the width is 6 microns, the thickness is 6 microns, the length is 700 microns, and the refractive index is 1.569;

5. The curved portion 142 of the optical waveguide 140c: the height difference H1 between the fifth end E5 and the sixth end E6 is 100 microns (μm), the width is 6 microns, the thickness is 6 microns, the length is 1000 microns, and the curved portion 142 is S-shaped with a radius of curvature being 2525 microns and has a refractive index being 1.569;
6. The coating layer 150 (or substrate): the width is 8 microns, the thickness is 6 microns, and the refractive index is 1.54;
7. Background refractive index is 1.544, and polarization mode of optical signal: TE mode.

The result of the simulation is that the optical coupling efficiency of the optical waveguide structure 100c is maintained good, and the optical mode in the optical waveguide 140c may be maintained to be the base mode.

Figure 12:
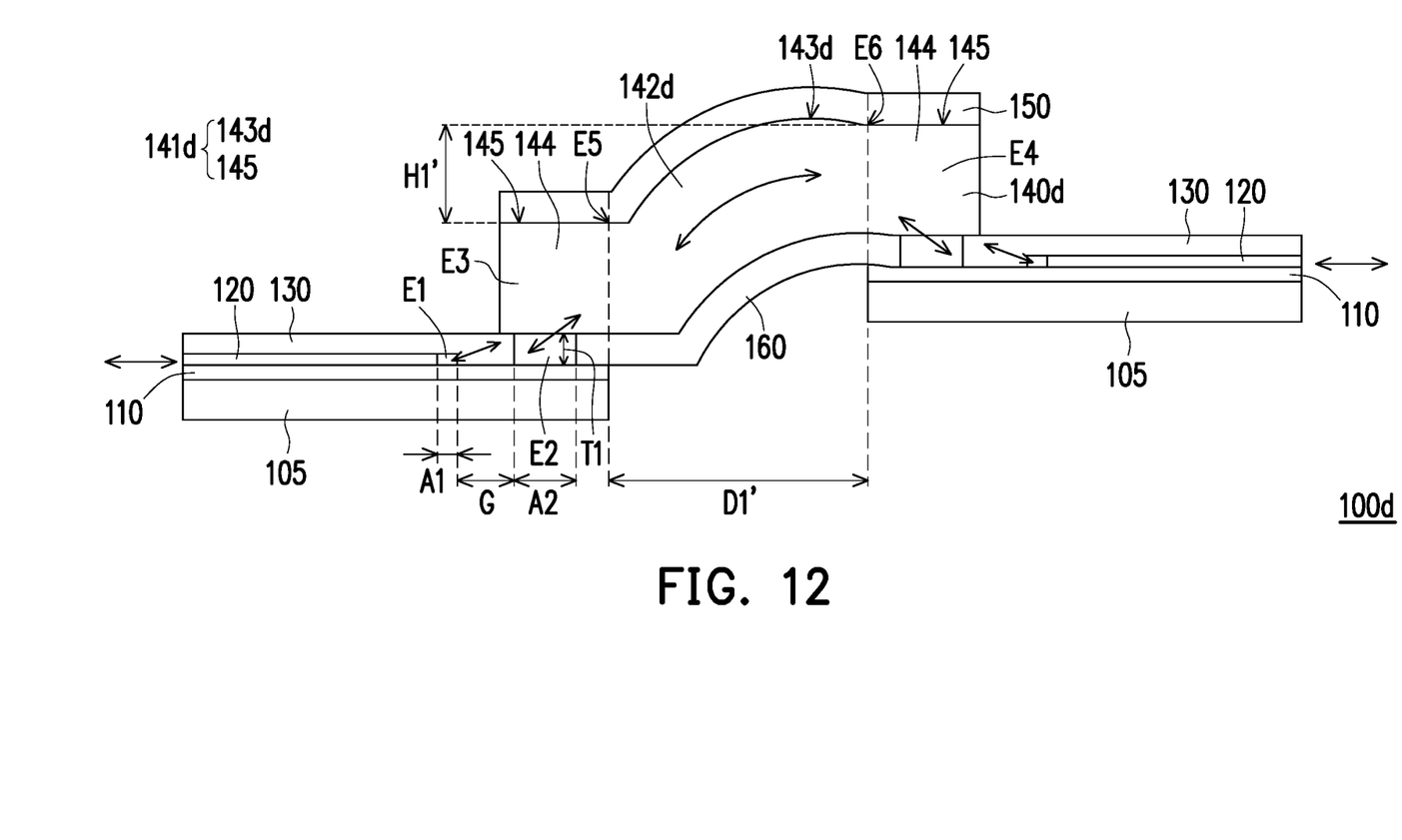
FIG. 12 is a schematic cross-sectional view of an optical waveguide structure according to another embodiment of the disclosure.

FIG. 12 is a schematic cross-sectional view of an optical waveguide structure according to another embodiment of the disclosure. Referring to FIG. 12, the optical waveguide structure 100d in this embodiment is similar to the optical waveguide structure 100c in FIG. 11A. It is to be noted that in the optical waveguide structure 100d, the surface 141d of the optical waveguide 140d connecting the third end E3 and the fourth end E4 includes a C-shaped surface, i.e. the C-shaped curved surface 143d. In other words, in this embodiment, the optical waveguide 140d includes two straight portions 144 and a curved portion 142d, which is C-shaped and connects the two straight portions 144. The curved portion 142d is a C-shaped portion having an fifth end E5 and the sixth end E6 opposite to the fifth end E5. The C shape means that the curved surface 143d has no inflection point. In this embodiment, the ratio of the height difference H1' between the third end E3 and the fourth end E4 to the distance D1' between the fifth end E5 and the sixth end E6 is less than 1.

In an embodiment, the optical coupling efficiency of the curved portion 142d of the optical waveguide 140d at a wavelength of 1310 nm is simulated and calculated by using the 2018 version of the Rsoft BeamPROP software, and the calculation conditions are as follows:
1. The curved portion 142d of the optical waveguide 140d: the height difference H1' between the fifth end E5 and the sixth end E6 (same as between the third end E3 and the fourth end E4) is 500 microns (μm), the width is 6 microns, the thickness is 6 microns, the length is 1000 microns, and the curved portion 142d is C-shaped with a radius of curvature being 2500 microns and has a refractive index being 1.569;
2. Background refractive index is 1.544, polarization mode of optical signal: TE mode.

The result of the simulation is that the optical coupling efficiency of the curved portion 142d of the optical waveguide 140d is 90% or more; that is, after a light passes through the curved portion 142d, the intensity of the light is maintained to be 90% or more of the intensity of the light before entering the curved portion 142.

In the aforementioned embodiments, the third end E3 and the fourth end E4 of the optical waveguide 140c or 140d are located at different height levels. However, in other embodiments, the third end E3 and the fourth end E4 of the optical waveguide may be located at the same height level. Moreover, in the aforementioned embodiments, the optical waveguide 140c or 140d has at least one straight portion 144 and a curved portion 142 or 142d. However, in other embodiments, an optical waveguide may have a curved portion having the aforementioned third end E3 and fourth end E4, but not have any straight portion.

Based on the above, in the optical waveguide structure of an embodiment of the disclosure, not only does the middle waveguide layer in the first end region have a first end having a width gradually decreased toward the second end region, the top cladding layer in the second end region has a second end having a width gradually decreased away from the first end region, and therefore the second end may be used as a mode converter of the optical signal to connect other optical waveguides (for example, organic optical waveguides) to improve the optical coupling efficiency with other optical waveguides. Furthermore, in the optical waveguide structure of an embodiment of the disclosure, since the middle waveguide layer in the first end region has a first end having a width gradually decreased toward the second end region, the effective refractive index of the middle waveguide layer in the first end region may be reduced to be more closely matched with the refractive index of the top cladding layer to improve the optical coupling efficiency. Moreover, since the top cladding layer in the second end region has a second end having a width gradually decreased away from the first end region, the effective refractive index of the top cladding layer in the second end region may be reduced to be more closely matched with the refractive indices of other optical waveguides (such as organic optical waveguides) to improve the optical coupling efficiency. In the optical waveguide structure of an embodiment of the disclosure, by using the flexible optical waveguide, two middle waveguide layers, two components or two chips coupled by the flexible optical waveguide may be located at different height levels, and the optical coupling efficiency is still maintained good.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:
1. An optical waveguide structure, comprising:
a bottom layer;
a middle waveguide layer disposed on the bottom layer;
a top cladding layer disposed on the middle waveguide layer and covering the middle waveguide layer, wherein a refractive index of the middle waveguide layer is greater than a refractive index of the bottom layer and greater than a refractive index of the top cladding layer, the optical waveguide structure has a first end region and a second end region, the middle waveguide layer in the first end region has a first end having a width gradually decreased toward the second end region, and the top cladding layer in the second end region has a second end having a width gradually decreased away from the first end region; and
an optical waveguide having a third end and a fourth end opposite to the third end, wherein the third end is disposed on the second end but does not overlap with the first end, and wherein a surface of the optical waveguide connecting the third end and the fourth end is a plane surface, a curved surface, or a combination thereof,
wherein the third end and the fourth end are located at different height levels, respectively,
wherein the optical waveguide includes a curved portion which is a C-shaped portion having a fifth end and a sixth end opposite to the fifth end, and a ratio of a height difference between the third end and the fourth end to a distance between the fifth end and the sixth end is less than 1.

2. An optical waveguide structure, comprising:

a bottom layer;

a middle waveguide layer disposed on the bottom layer;

a top cladding layer disposed on the middle waveguide layer and covering the middle waveguide layer, wherein a refractive index of the middle waveguide layer is greater than a refractive index of the bottom layer and greater than a refractive index of the top cladding layer, the optical waveguide structure has a first end region and a second end region, the middle waveguide layer in the first end region has a first end having a width gradually decreased toward the second end region, and the top cladding layer in the second end region has a second end having a width gradually decreased away from the first end region; and an optical waveguide having a third end and a fourth end opposite to the third end, wherein the third end is disposed on the second end but does not overlap with the first end, and wherein a surface of the optical waveguide connecting the third end and the fourth end is a plane surface, a curved surface, or a combination thereof, wherein the third end and the fourth end are located at different height levels, respectively, wherein the optical waveguide includes a curved portion which is an S-shaped portion having a fifth end and a sixth end opposite to the fifth end, and a ratio of a height difference between the third end and the fourth end to a distance between the fifth end and the sixth end is less than 0.4.

3. The optical waveguide structure of claim 1, wherein a spacing exists between the first end region and the second end region.

4. The optical waveguide structure of claim 3, wherein the spacing falls within a range of 0.1 microns to 200 microns.

5. The optical waveguide structure of claim 1, wherein the bottom layer is a substrate or an optical waveguide layer disposed on a substrate.

6. The optical waveguide structure of claim 1, wherein a material of the middle waveguide layer comprises silicon or a compound of silicon.

7. The optical waveguide structure of claim 1, wherein the top cladding layer exists in a central axis position of the optical waveguide structure in the second end region.

8. The optical waveguide structure of claim 1, wherein a minimum width of the first end is greater than 0.01 microns and less than 0.2 microns.

9. The optical waveguide structure of claim 1, wherein a minimum width of the second end is greater than 0.1 microns and less than 2 microns.

10. The optical waveguide structure of claim 1, wherein a maximum thickness of the top cladding layer is less than 3 microns.

11. The optical waveguide structure of claim 1, wherein the third end of the optical waveguide is in contact with the second end.

12. The optical waveguide structure of claim 1, wherein the third end of the optical waveguide wraps the second end.

13. The optical waveguide structure of claim 1, wherein a gap is kept between the third end of the optical waveguide and the second end, and the second end is evanescently coupled to the optical waveguide.

* * * * *